(12) United States Patent
Meyyappan et al.

(10) Patent No.: US 11,622,466 B2
(45) Date of Patent: Apr. 4, 2023

(54) LOW FORCE LIQUID METAL INTERCONNECT SOLUTIONS

(71) Applicant: Intel Corporation, Santa Clara, CA (US)

(72) Inventors: Karumbu Meyyappan, Portland, OR (US); Kyle Arrington, Gilbert, AZ (US); David Craig, Hillsboro, OR (US); Pooya Tadayon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 16/902,048

(22) Filed: Jun. 15, 2020

(65) Prior Publication Data

US 2021/0392774 A1    Dec. 16, 2021

(51) Int. Cl.
*H01L 23/498* (2006.01)
*H05K 7/14* (2006.01)
*H05K 7/20* (2006.01)
*H01L 23/22* (2006.01)

(52) U.S. Cl.
CPC ........... *H05K 7/1481* (2013.01); *H01L 23/22* (2013.01); *H05K 7/20272* (2013.01)

(58) Field of Classification Search
CPC . H01L 23/49827; H01L 23/50; H01L 23/538; H01L 23/5385
See application file for complete search history.

(56) References Cited

U.S. PATENT DOCUMENTS

2009/0273083 A1* 11/2009 Sauciuc ............... H05K 3/321
257/E23.079

* cited by examiner

*Primary Examiner* — Jae Lee
(74) *Attorney, Agent, or Firm* — Schwabe, Williamson & Wyatt, P.C.

(57) ABSTRACT

Embodiments disclosed herein include an electronic package. In an embodiment, the electronic package comprises a package substrate having a first surface and a second surface opposite from the first surface, and a die on the first surface of the package substrate. In an embodiment, the electronic package further comprises a socket interface on the second surface of the package substrate. In an embodiment, the socket interface comprises a first layer, wherein the first layer comprises a plurality of wells, a liquid metal within the plurality of wells, and a second layer over the plurality of wells.

21 Claims, 11 Drawing Sheets

LOW FORCE LIQUID METAL INTERCONNECT SOLUTIONS

TECHNICAL FIELD

Embodiments of the present disclosure relate to semiconductor devices, and more particularly to interconnect architectures that utilize liquid metal (LM) solutions.

BACKGROUND

As land grid array (LGA) packages continue to grow in size and number of pads, the loading requirement for the socket to make them electrically active is also growing. This loading force impacts the first thermal interface material (TIM1) performance and the shape of the integrated heat spreader (IHS) (which impacts the second TIM (TIM2) performance).

Liquid metal (LM) solutions have been proposed for providing socket interconnects. However, LM solutions suffer from several critical limitations. For example, even though the deposition processes for LMs are well described, there is little discussion on how to make stable electrical connections considering LMs form an oxide shell instantaneously. This prevents the LM from bonding to the electrical pad on the CPU/substrate/PCB. It has been shown that strong acids and/or bases may be applied to the LM to break the oxide shell. However, such treatments may affect long term reliability. Additionally, such treatments have been shown to drive large resistance variations, which is undesirable.

LMs are also hard to contain. For example, the LM tends to stick to socket pins or can escape from the well. Furthermore, the films used to contain the LM can become conductive, which results in an electrical short. Reservoir based LM interconnect solutions involve more assembly steps to form the reservoirs. They also introduce the risk of contaminating materials used in chip packaging since the LMs are typically corrosive.

EMBODIMENTS OF THE PRESENT DISCLOSURE

Figure 1A:
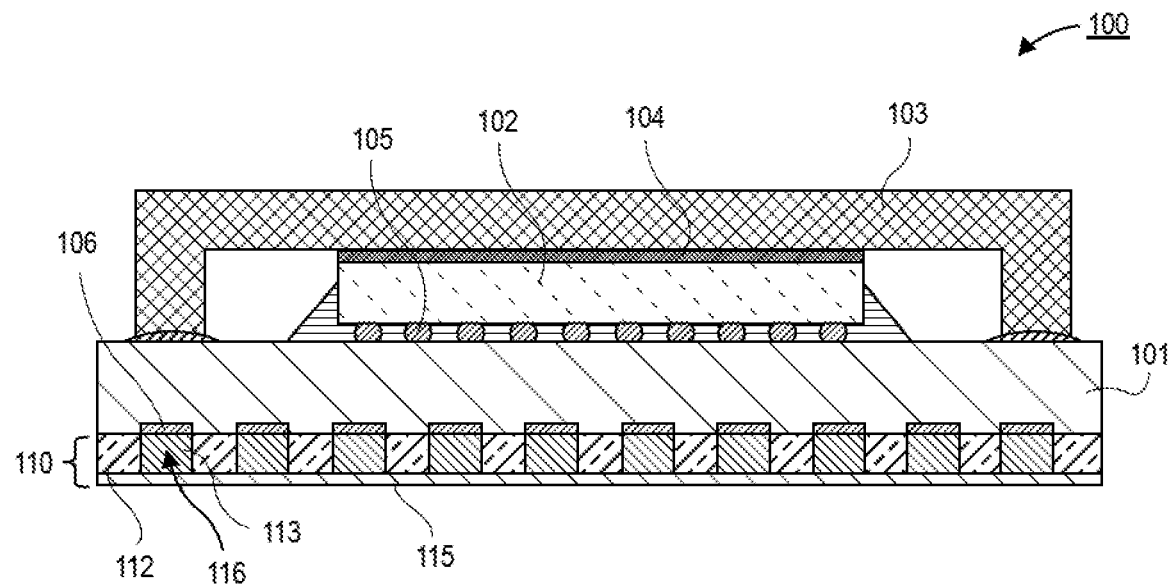
FIG. 1A is a cross-sectional illustration of an electronic package with a socket interface that comprises liquid metal (LM) within wells over contact pads, in accordance with an embodiment.

Described herein are interconnect architectures that utilize liquid metal (LM) solutions, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, liquid metal (LM) architectures have significant issues when used in socket interconnects. Accordingly, embodiments disclosed herein comprise socket designs that provide electrical activation of the LM. Particularly, the outer oxide shell of the LM is broken in order to allow for bonding to contact pad and the socket pin. The outer oxide shell is broken by a coalescence socket that stirs the LM. The stirring breaks the oxide shell and allows for the LM to coalesce. Such mechanical breaking of the oxide shell avoids the need for strong acids or bases. Additionally, the mechanical coalescence of the LM allows for low resistance variation (e.g., 2 mOhm or less).

Furthermore, since the LM provides an electrical connection between the socket pin and the contact pad, there is no need to directly contact the socket pin to the contact pad. This allows for lower forces to be used during socketing (e.g., less than 0.5 gram-force (gf)), even when the electronic package exhibits significant warpage and for packages with large pin counts (e.g., 7,000 or greater, or 10,000 or greater).

Additionally, embodiments disclosed herein include a capping solution that prevents the LM from escaping from the well. For example, one or more cap layers of a self-sealing material (e.g., a closed cell foam or an open cell foam) is used. The socket pin may be inserted through the cap layer, and the cap layer will provide a seal around the socket pin. Upon retraction of the socket pin, the cap layer will reseal and also will clean LM from the extracted socket pin. Furthermore, the cap layers disclosed herein do not become electrically conductive. As such, there is no risk of electrical shorts in the device. In an embodiment, such LM socket architectures may be used for testing applications or for a final product.

Referring now to FIG. 1A, a cross-sectional illustration of an electronic package 100 is shown, in accordance with an embodiment. The electronic package may comprise a package substrate 101 and a die 102 attached to the package substrate by interconnects 105. The interconnects 105 are shown as solder bumps. However, it is to be appreciated that any first level interconnect (FLI) may be used to connect the die 102 to the package substrate 101. Additionally, while a single die 102 is shown, it is to be appreciated that a plurality of dies 102 may be included within the electronic package 100. In an embodiment, a heat spreader 103 may be thermally coupled to the die 102 by a thermal interface material (TIM) 104.

In an embodiment, the package substrate 101 may comprise a plurality of contact pads 106. The contact pads 106 may be disposed along a surface of the package substrate 101 opposite from the die 102. In an embodiment, the one or more of the contact pads 106 may be electrically coupled to the interconnects 105 through conductive routing (not shown) in the package substrate 101.

In an embodiment, a socket interface 110 may be disposed on the electronic package 100. The socket interface 110 may be positioned over the surface of the package substrate 101 opposite from the die 102. In an embodiment, the socket interface 110 may comprise a first layer 112. The first layer 112 may comprise a plurality of wells 116. As such, the first layer 112 may be referred to herein as a "well layer" 112. In an embodiment, the well layer 112 may comprise a substantially non-conductive material, such as, but not limited to an organic polymeric material (e.g., polyimide) or a patternable photoresist. The well layer 112 may be a laminated layer that is subsequently patterned. The wells 116 may each be aligned over one of the contact pads 106.

In an embodiment, a LM 113 is disposed in each of the wells 116. The LM 113 may be any suitable LM 113 that is liquid at normal operating temperatures of the electronic package 100. In a particular embodiment, the LM 113 comprises gallium, or the LM 113 comprises a gallium based alloy. Such LMs 113 have a very low melting point. Several eutectic compositions of a gallium alloy stay in the liquid state at room temperature and below room temperature conditions. Unlike mercury, gallium alloys are safer, have low vapor pressures (i.e., they may not boil until approximately 1,500° C.) and are used in medical industries.

As noted above, a drawback to using LMs 113 is the formation of an oxide shell, which reduces the conductivity of the LM 113. Accordingly, embodiments may include a coalesced LM 113. That is, the LM 113 may be substantially free of oxide shells. For example, a mechanical coalescence process may be used to coalesce the LM 113. Such a mechanical process for coalescing the LM 113 is described in greater detail below.

While being benign to organic materials (such as the well layer 112), LMs 113 are known to react with most metals, resulting in damaging corrosion. Accordingly, a second layer 115 is disposed over the well layer 112. The second layer 115 may be referred to herein as a capping layer 115 since the capping layer 115 caps the wells 116. The capping layer 115 seals the well in order to prevent the LM 113 from escaping.

In an embodiment, the capping layer 115 is a self-sealing material. For example, the capping layer 115 may comprise a closed cell foam, an open cell foam, nonwoven or woven meshes, or an elastic material. The capping layer 115 may also comprise a composite of two or more different material layers. In an embodiment, the capping layer 115 may be a laminated layer or deposited with any other suitable deposition process. In an embodiment, the self-sealing property of the capping layer 115 allows for a socket pin to be inserted through the capping layer in order to contact the LM 113. After the pin breaks the seal, the capping layer 115 will seal against the pin. Upon removal of the pin, the capping layer 115 will reseal itself. Additionally, the capping layer 115 may be used to clean the pin during removal of the pin. That is, the capping layer 115 may clean LM 113 off of the pin as the pin is removed from the well 116. In some embodiments, the capping layer 115 is also penetrateable with a low force. The capping layer 115 may also be chemically compatible with the LM 113 in order to prevent the capping layer 115 from becoming conductive and shorting the part.

Figure 1B:
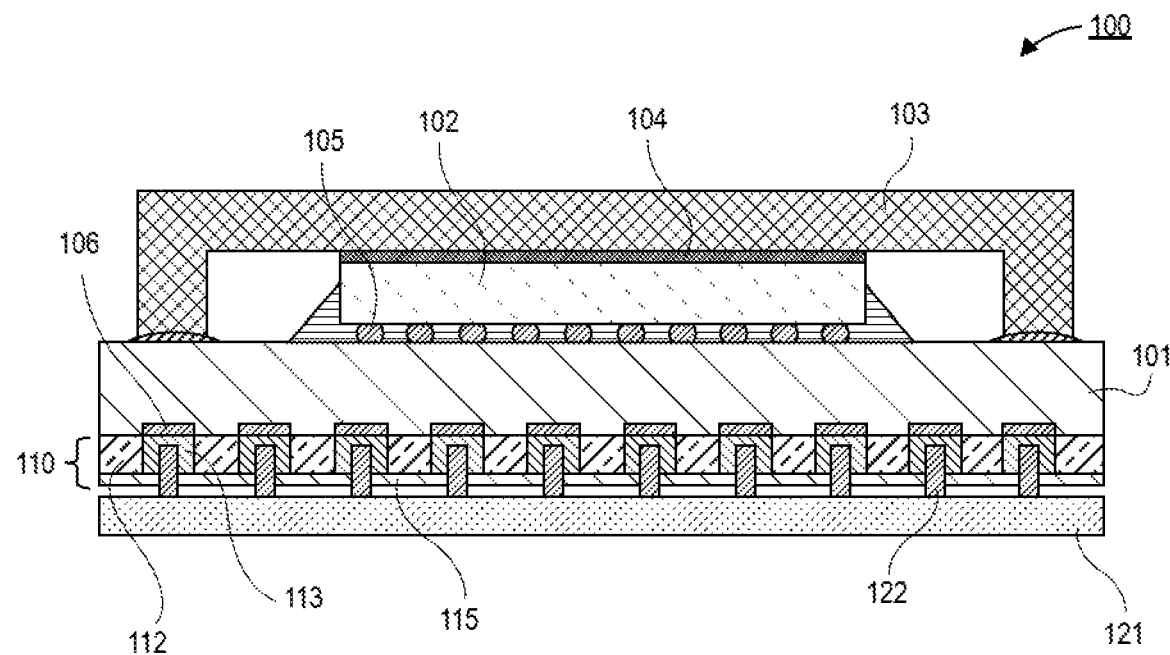
FIG. 1B is a cross-sectional illustration of an electronic package with a socket interface that comprises LM and a socket interfacing with the socket interface, in accordance with an embodiment.

Referring now to FIG. 1B, a cross-sectional illustration of an electronic package 100 that is mated with a socket is shown, in accordance with an embodiment. In an embodiment, the package 100 may be substantially similar to the package 100 in FIG. 1A. As shown, socket pins 122 extending up from a socket substrate 121 penetrate the capping layer 115 and are inserted into the LM 113. Since the LM 113 is coalesced, the LM provides an electrical path between the socket pins 122 and the contact pads 106. Accordingly, the socket pins 122 do not need to be in direct contact with the contact pads 106. This is particularly beneficial when the package substrate 101 is warped. As such, the applied force during mating is reduced since warpage does not need to be overcome. While all of the socket pins 122 are shown as being spaced away from the contact pads 106, it is to be appreciated that due to warpage, one or more of the socket pins 122 may contact pads 106.

Figure 2A:
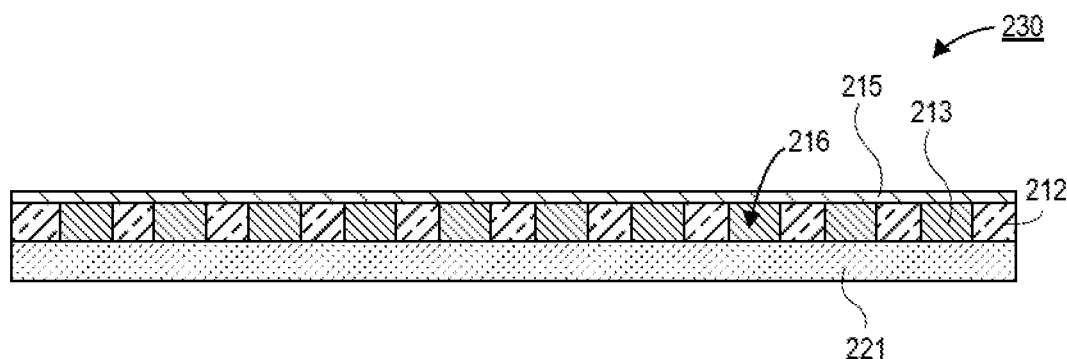
FIG. 2A is a cross-sectional illustration of a socket with LM for a pin grid array (PGA) electronic package, in accordance with an embodiment.

Referring now to FIG. 2A, a cross-sectional illustration of a socket 230 is shown, in accordance with an embodiment. In an embodiment, the socket 230 may be used in conjunction with a package substrate that comprises the pins, such as a pin grid array (PGA) package. That is, the socket 230 may not include pins in some embodiments.

In an embodiment, the socket 230 may comprise a socket substrate 221. The socket substrate 221 may be an organic substrate. The socket substrate 221 may comprise electrical routing (not shown). In some embodiments, the socket substrate 221 may be a board (e.g., a printed circuit board (PCB)). A well layer 212 may be disposed over the socket substrate 221. The well layer 212 may comprise a plurality of wells 216. In an embodiment, the well layer 212 may comprise a substantially non-conductive material, such as, but not limited to an organic polymeric material (e.g., polyimide) or a patternable photoresist. The well layer 212 may be substantially similar to the well layer 112 described above.

In an embodiment, a LM 213 may be disposed in the wells 216. In an embodiment, the LM 213 may comprise gallium or a gallium alloy. The LM 213 may be a coalesced LM 213. That is, the LM 213 may be substantially free from oxide shells. The coalescing process may be implemented with a mechanical coalescing process, as will be described in greater detail below. The LM 213 may be substantially similar to the LM 113 described above.

In an embodiment, a capping layer 215 is disposed over the well layer 212. The capping layer 215 also covers the wells 216 in order to seal the LM 213 within the wells 216. In an embodiment, the capping layer 215 is a self-sealing material. For example, the capping layer 215 may comprise a closed cell foam, an open cell foam, nonwoven or woven meshes, or an elastic material. The capping layer 215 may also comprise a composite of two or more different material layers. The capping layer 215 may be substantially similar to the capping layer 115 described above.

Figure 2B:
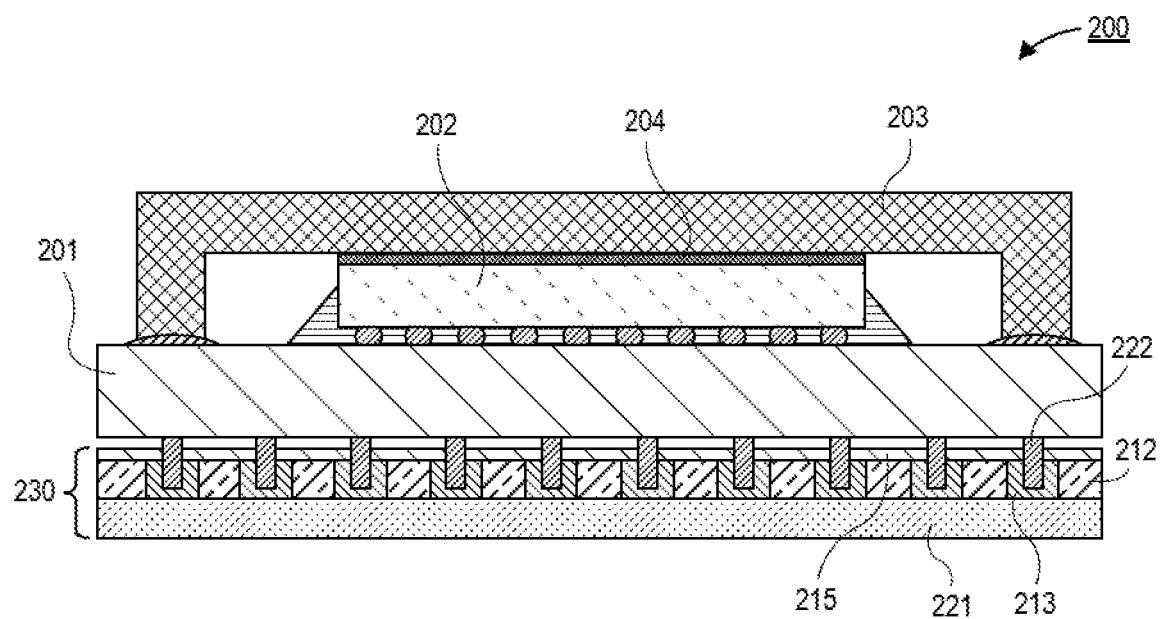
FIG. 2B is a cross-sectional illustration of a socket with LM and a PGA electronic package attached to the socket, in accordance with an embodiment.

Referring now to FIG. 2B, a cross-sectional illustration of an electronic package 200 mated with the socket 230 is shown, in accordance with an embodiment. The electronic package 200 may comprise a package substrate 201 and a die 202 attached to the package substrate 201. A heat spreader 203 may be thermally coupled to the die 202 by a TIM 204. In an embodiment, the electronic package 200 may comprise a plurality of pins 222 that extend away from a surface of the package substrate 201 opposite from the die 202. The pins 222 may be electrically coupled to the die 202 through routing (not shown) in the package substrate 201. In an embodiment, the electronic package 200 may be a PGA package.

As shown, the pins 222 are inserted through the capping layer 215 and into the LM 213. In an embodiment, the LM 213 provides an electrical connection between the pins 222 and conductive features (not shown) on the surface of the socket substrate 221. That is, the pins 222 need not bottom out and directly contact the socket substrate 221 in order to form an electrical connection between the electronic package 200 and the socket substrate 221.

Figure 3A:
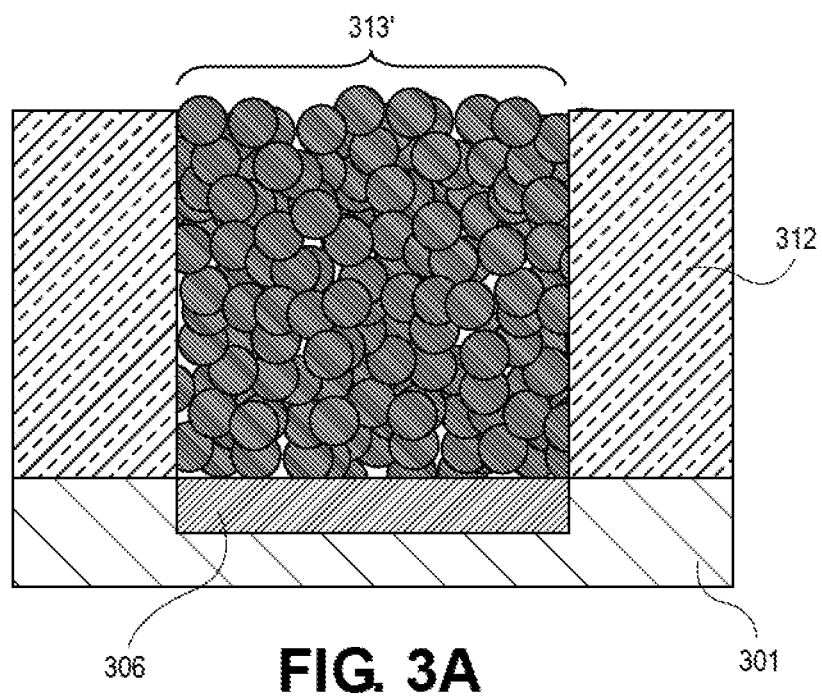
FIG. 3A is a cross-sectional illustration of a well with a LM that comprises a plurality of oxide shells around nanoparticles, in accordance with an embodiment.
Figure 3B:
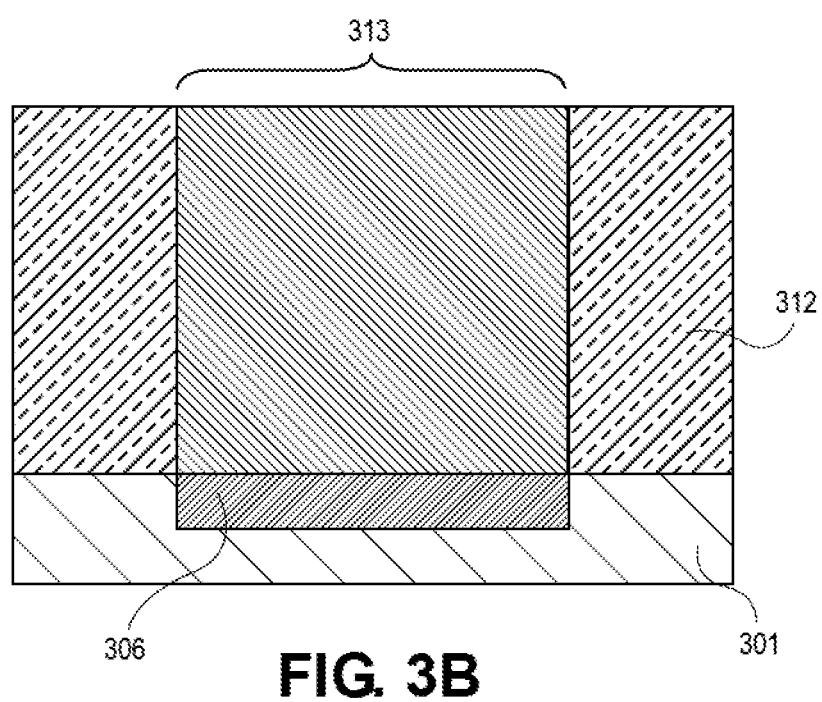
FIG. 3B is a cross-sectional illustration of a well with a coalesced LM, in accordance with an embodiment.

Referring now to FIGS. 3A and 3B, cross-sectional illustrations depicting the difference between a LM 313' as deposited and a coalesced LM 313 are shown, in accordance with an embodiment. In each of FIGS. 3A and 3B, the LMs 313' and 313 are deposited in a well of a well layer 312. The well layer 312 is over a package substrate 301 and a contact pad 306. While shown in the context of a socket interface on an electronic package, it is to be appreciated that substantially similar concepts also apply when the LMs 313' and 313 are on a socket substrate (e.g., similar to what is shown in FIGS. 2A and 2B).

Referring now to FIG. 3A, an as deposited LM 313' is shown in the well. The LM 313' is shown as comprising a plurality of nanoparticles. The individual nanoparticles may each comprise an oxide shell. The oxide shell may have a thickness of approximately 1 nm or less. The nanoparticles of the LM 313' may be generated through sonication of liquid metal in a carrier solution. For example, the carrier solution may comprise isopropyl alcohol (IPA). The carrier solution drops the surface tension of the LM 313' and allows it to flow into the wells. The oxide shells increase the electrical resistivity of the LM 313' so that the LM 313' is not suitable for providing an electrical interconnect.

In order to overcome the oxide shell and allow for improved electrical conductivity, a mechanical coalescence process is used. The coalesced LM 313 is shown in FIG. 3B. As shown in the illustration, the nanoparticles have coalesced into a single body of liquid (i.e., LM 313). Substantially removing the oxide shells results in a decrease in the electrical resistivity and allows for the LM 313 to be used as an electrical interconnect with a low resistance variation. For example, the resistance variation of the LM 313 in the various wells of an electronic package may be less than approximately 5 mOhm, or less than approximately 2 mOhm.

Referring now to FIGS. 4A-4H, a series of cross-sectional illustrations depicting a process for forming a socket interface on an electronic package 400 is shown, in accordance with an embodiment.

Figure 4A:
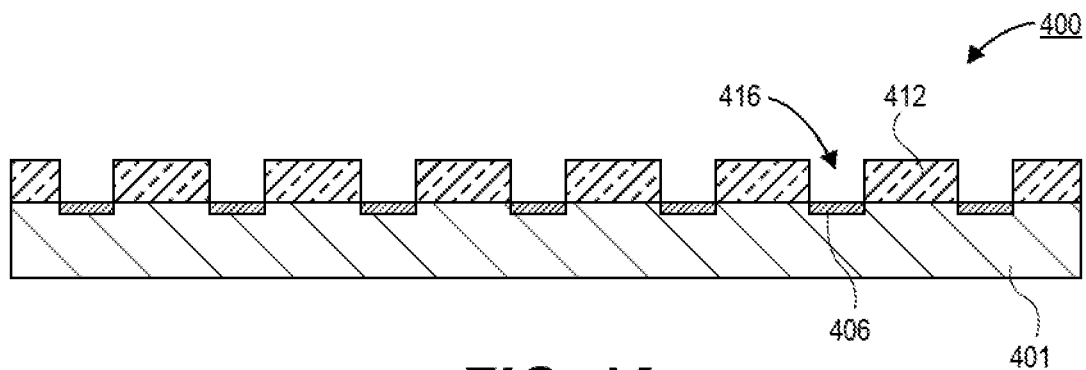
FIGS. 4A-4H are cross-sectional illustrations depicting a process for forming a socket interface with a coalesced LM, in accordance with an embodiment.

Referring now to FIG. 4A, a cross-sectional illustration of an electronic package 400 in a stage of manufacture is shown, in accordance with an embodiment. The electronic package 400 comprises a package substrate 401 with a plurality of contact pads 406. In an embodiment, a well layer 412 is disposed over the package substrate 401. The well layer 412 may be disposed with a lamination process or the like. The well layer 412 may be substantially similar to the well layers 112, 212, 312 described above. In an embodiment, the well layer 412 is patterned to form a plurality of wells 416. The wells 416 may be aligned with the contact pads 406. For example, individual ones of the wells 416 may be disposed over individual ones of the contact pads 406. As such, the contact pads 406 may be exposed.

Figure 4B:
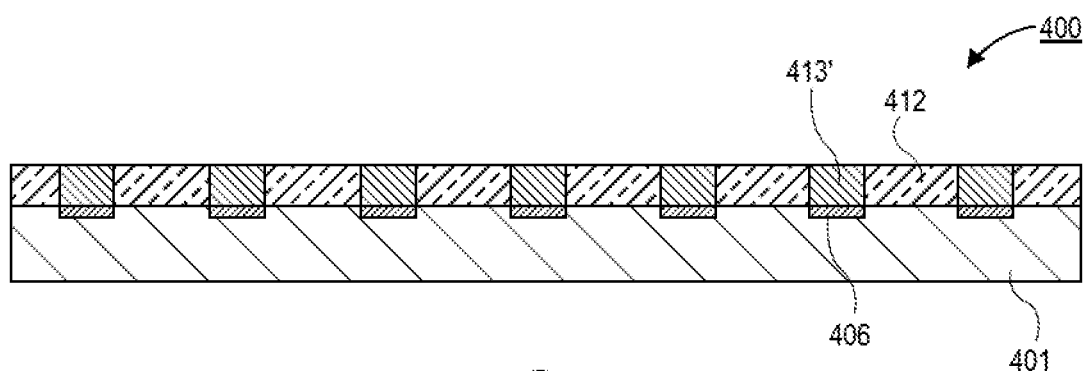

Referring now to FIG. 4B, a cross-sectional illustration of the electronic package 400 after a LM 413' is disposed into the wells 416 is shown, in accordance with an embodiment. In an embodiment, the LM 413' may comprise a plurality of nanoparticles with an oxide shell. For example, the LM 413' may be similar in structure and composition to the LM 313' described above with respect to FIG. 3A. In an embodiment, the nanoparticles of the LM 413' may be generated through sonication of liquid metal in an IPA carrier solution. The carrier solution drops the surface tension of the LM 413' and allows it to flow into the wells. The oxide shells increase the electrical resistivity of the LM 413' so that the LM 413' is not suitable for providing an electrical interconnect.

Figure 4C:
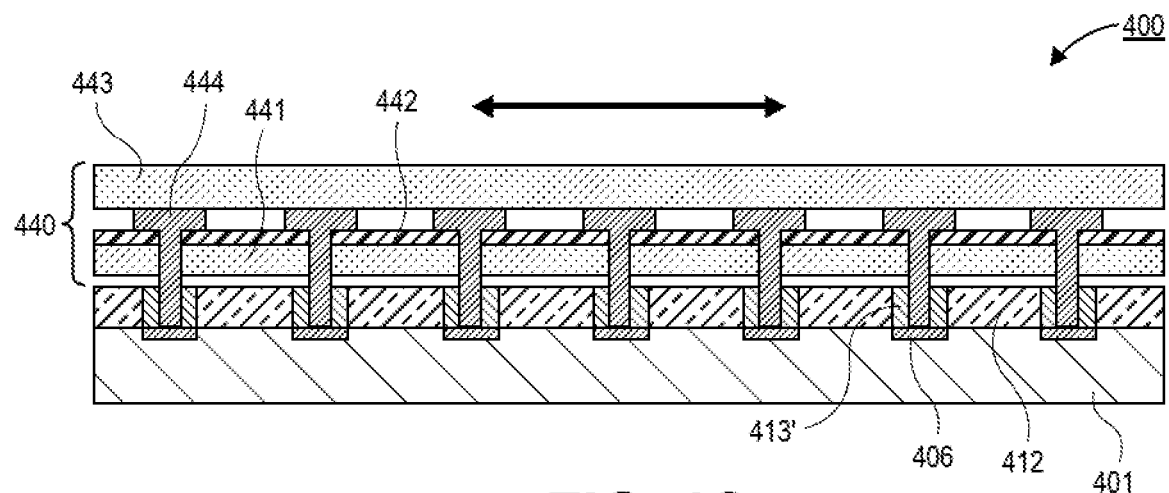

Referring now to FIG. 4C, a cross-sectional illustration of the electronic package 400 during the mechanical coalescing process is shown, in accordance with an embodiment. In an embodiment, a coalescing socket 440 is inserted into the LM 413'. The coalescing socket 440 comprises a socket body 441, a first layer 442 over the socket body 441, and a second layer 443 over the first layer 442. In an embodiment, a socket pin 444 extends through the first layer 442 and the socket body 441. The second layer 443 presses down on the socket pin 444.

In an embodiment, the socket pin 444 extends down into the LM 413'. In an embodiment, the socket pins 444 all extend down to the contact pads 406. Even with warpage of the electronic package 400, this is made possible by the construction of the coalescing socket 440. Particularly, the first layer 442 is a compressible layer. That is, the first layer 442 can be locally compressed in order to provide non-uniform displacements of the socket pins 444 to accommodate the warpage. In some embodiments, the first layer 442 may be a foam.

It is to be appreciated that the coalescing socket 440 need not provide electrical conductivity, since the socket is used to coalesce the LM 413' instead of for providing an electrical interconnect. As such, the socket pins 444 may be any suitable material, including non-conductive materials. For example, the socket pins 444 may be any rigid material that is metallic or non-metallic.

As shown by the arrows, the coalescing socket 440 is displaced back and forth so that the socket pins 444 pass through substantially the entire volume of the well. This allows for the oxide shells of each of the nanoparticles of the LM 413' to be broken and the LM 413' to coalesce. While the arrows show displacement in the X-direction, it is to be appreciated that displacement may also be provided in the Y-direction (out of the plane of the page) and in the Z-direction, in order to break substantially all of the oxide shells in the well.

Figure 4D:
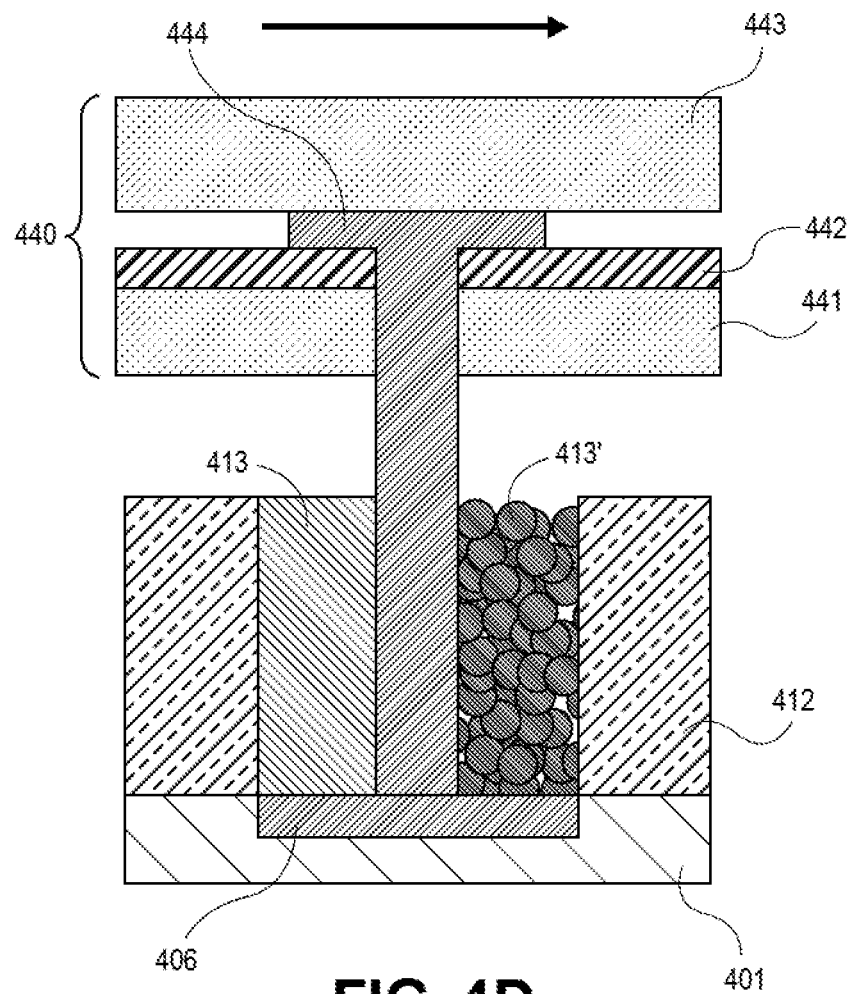

The mechanical coalescence process is shown in greater detail in FIG. 4D. As shown, the socket pin 444 is traversing from the left edge of the well to the right edge of the well. The LM 413 to the left of the socket pin 444 has been coalesced, whereas the LM 413' to the right of the socket pin 444 remains uncoalesced with oxide shells around nanoparticles. As the socket pin 444 continues to traverse to the right edge of the well, all of the remaining LM 413' will also be converted to coalesced LM 413.

Figure 4E:
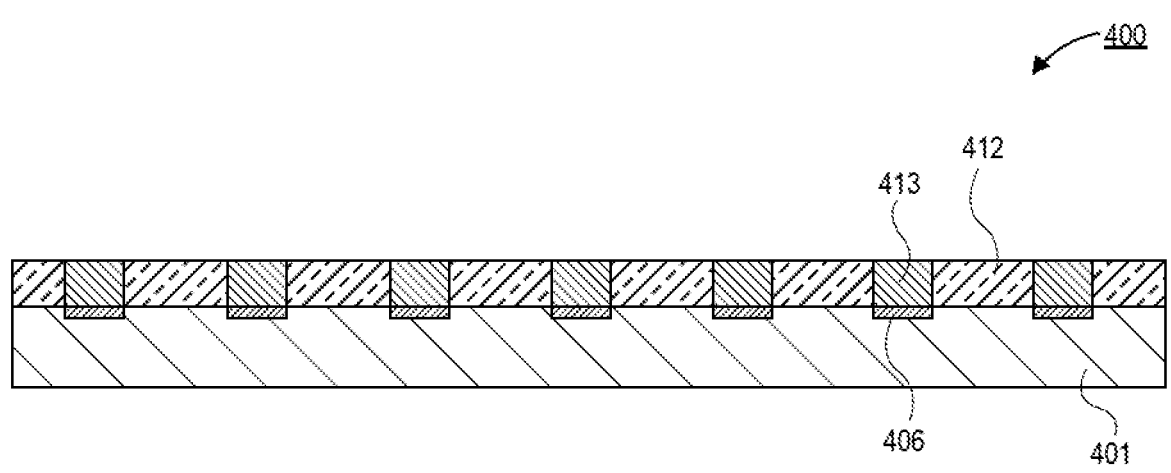

Referring now to FIG. 4E, a cross-sectional illustration of the electronic package 400 after all of the LM 413' has been coalesced into LM 413 is shown, in accordance with an embodiment. At this point, the LM 413 is electrically active and bonded to the underlying contact pads 406. The LM 413 can now be used to provide an electrical interconnect to an electrical socket pin.

Figure 4F:
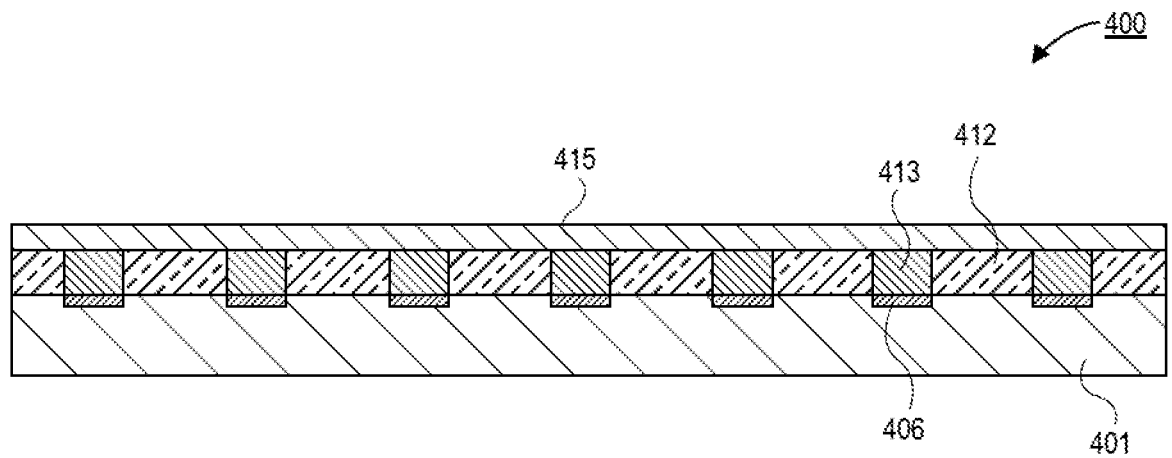
Figure 4G:
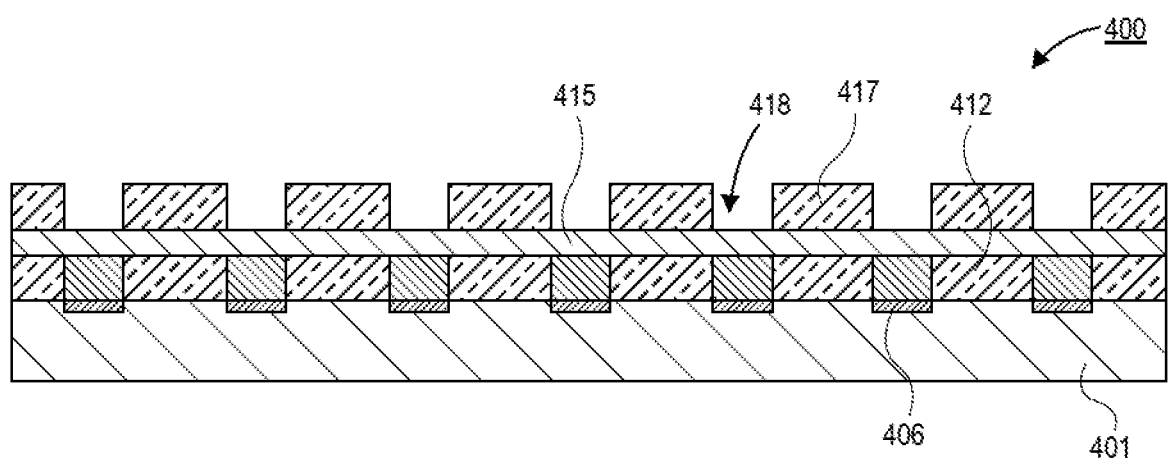

Referring now to FIG. 4F, a cross-sectional illustration of the electronic package 400 after a capping layer 415 is disposed over the well layer 412 is shown, in accordance with an embodiment. In an embodiment, the capping layer 415 is a self-sealing layer. For example, the capping layer 415 may comprise a closed cell foam, an open cell foam, nonwoven or woven meshes, or an elastic material. The capping layer 415 may also comprise a composite of two or more different material layers. In an embodiment, the capping layer 415 may be a laminated layer or deposited with any other suitable deposition process. In an embodiment, the self-sealing property of the capping layer 415 allows for a socket pin to be inserted through the capping layer in order to contact the LM 413. After the pin breaks the seal, the capping layer 415 will seal against the pin. Upon removal of the pin, the capping layer 415 will reseal itself. Additionally, the capping layer 415 may be used to clean the pin during removal of the pin. That is, the capping layer 415 may clean LM 413 off of the pin as the pin is removed from the well 416. In some embodiments, the capping layer 415 is also penetrateable with a low force. The capping layer 415 may also be chemically compatible with the LM 413 in order to prevent the capping layer 415 from becoming conductive and shorting the part.

In some embodiments, the processing may end after the formation of the capping layer 415. However, in other embodiments, additional structures may be included in the socket interface. For example, in FIG. 4G, a second well layer 417 is disposed over the capping layer 415. The second well layer 417 may have wells 418 that are aligned over the LM 413.

Figure 4H:
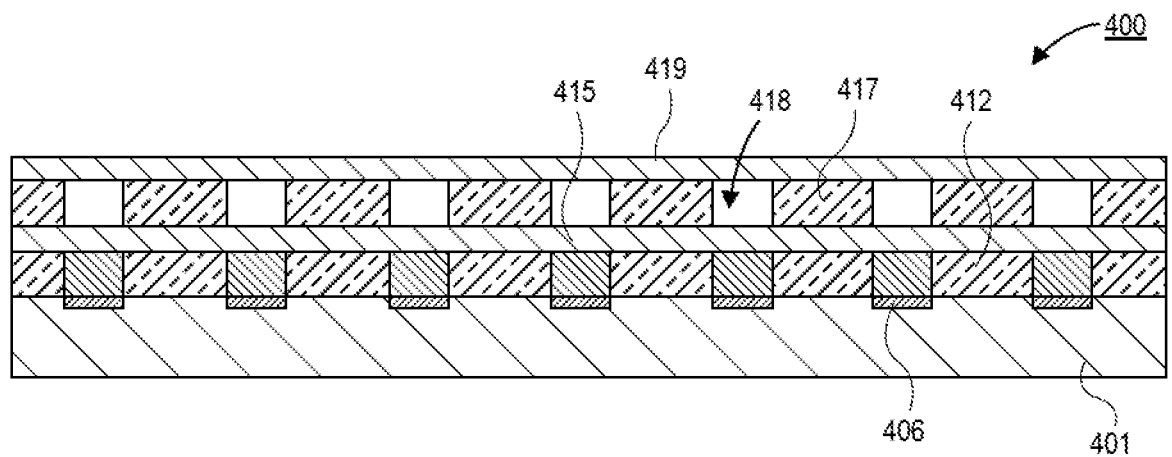

Referring now to FIG. 4H, a cross-sectional illustration of the electronic package 400 after a second capping layer 419 is disposed over the second well layer 417 is shown, in accordance with an embodiment. The inclusion of the second well layer 417 and the second capping layer 419 provide a second confined well 418 in order to provide further protection against the LM 413 spreading about the electronic package 400. In an embodiment, the capping layer 415 and the second capping layer 419 may comprise the same material. In other embodiments, the capping layer 415 and the second capping layer 419 comprise different materials.

In FIGS. 4A-4H, the socket interface is shown as being formed on an electronic package. However, it is to be appreciated that the socket interface may be formed on a board (e.g., a PCB) or on any other type of substrate used for interfacing with a socket pin architecture.

Referring now to FIGS. 5A-5D, a series of cross-sectional illustrations depicting a process for forming a coalescence socket 540 is shown, in accordance with an embodiment.

Figure 5A:
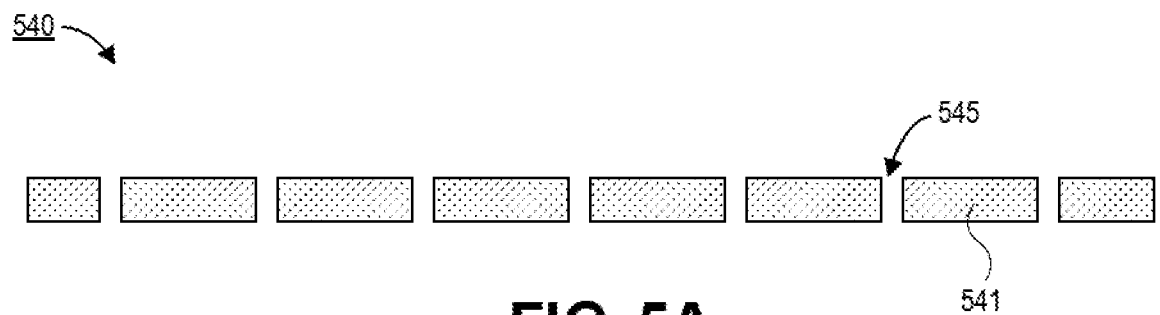
FIGS. 5A-5D are cross-sectional illustrations depicting a process for forming a coalescence socket used to coalesce a LM, in accordance with an embodiment.

Referring now to FIG. 5A, a cross-sectional illustration of a socket body 541 of a socket 540 is shown, in accordance with an embodiment. In an embodiment, the socket body 541 may comprise a plurality of holes 545 that pass through the socket body.

Figure 5B:
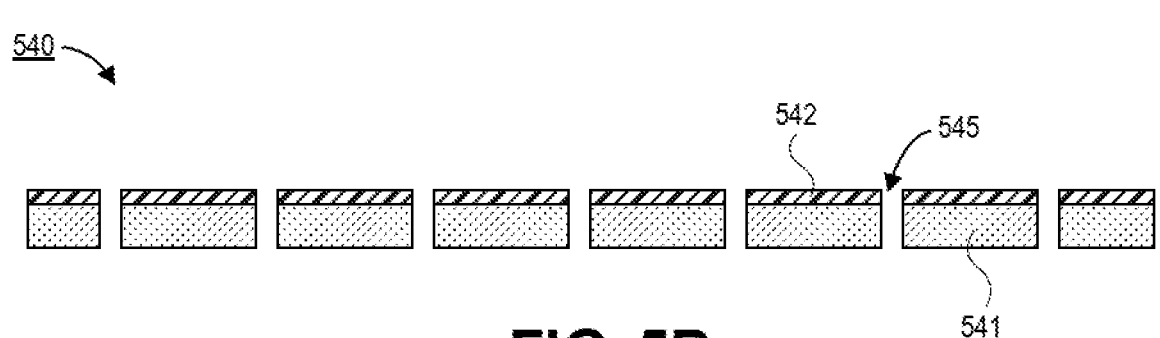

Referring now to FIG. 5B, a cross-sectional illustration of the socket 540 after a first layer 542 is disposed over the socket body 541 is shown, in accordance with an embodiment. The first layer 542 may be an easily compressible material or spring material. For example, the first layer 542 may be a foam or the like. In an embodiment, the holes 545 may also pass through the first layer 542.

Figure 5C:
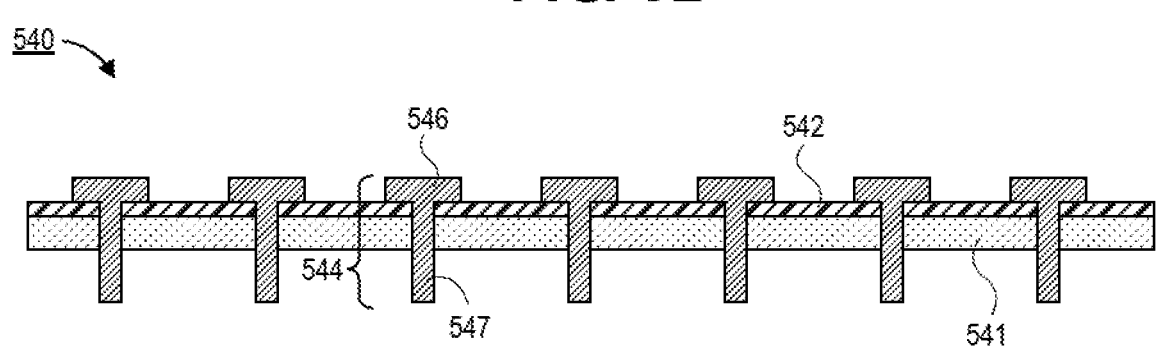

Referring now to FIG. 5C, a cross-sectional illustration of the socket 540 after socket pins 544 are disposed through the holes 545 is shown, in accordance with an embodiment. In an embodiment, the socket pins 544 comprise a pin 547 and a head 546. The pin 547 passes through the holes 545 and the head 546 rests on the first layer 542. The socket pins 544 may be a metallic material or a non-metallic material.

Figure 5D:
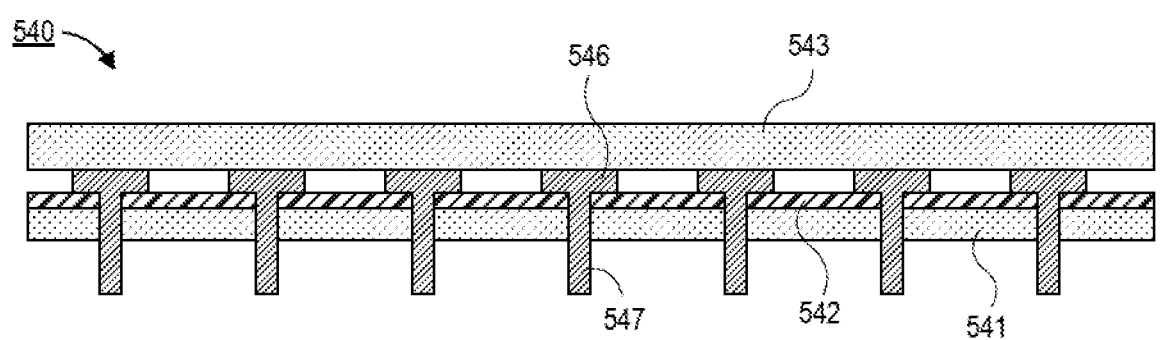

Referring now to FIG. 5D, a cross-sectional illustration of the socket 540 after a second layer 543 is disposed over the socket pins 544 is shown, in accordance with an embodiment. In an embodiment, the second layer 543 compresses the head 546 against the first layer 542. The presence of the first layer 542 allows for non-uniform displacement of the pins 547 in order to account for warpage in an underlying substrate, as described above.

In the embodiments described above, the LM materials are disclosed as being confined in a well. However, it is to be appreciated that embodiments are not limited to such configurations. This is because the oxide shells of uncoalesced LMs are sticky. Therefore, the uncoalesced LMs may be attached to a socket pin with a dipping process. A mechanical coalescing process may then be implemented to convert the uncoalesced LM into an electrically active coalesced LM.

Figure 6:
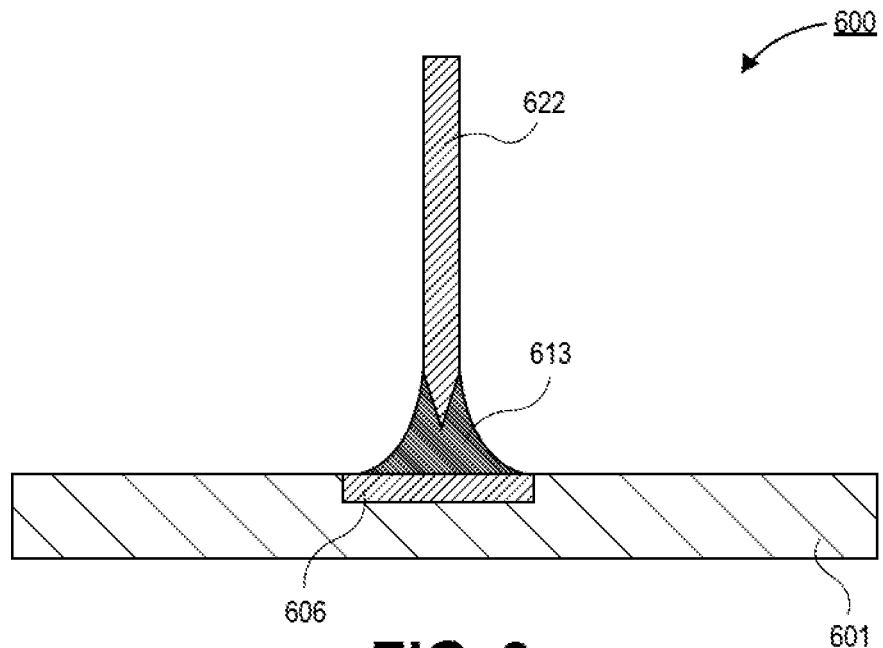
FIG. 6 is a cross-sectional illustration of a socket pin attached to a contact pad with a LM, in accordance with an embodiment.

Referring now to FIG. 6, a cross-sectional illustration of an electronic package 600 is shown, in accordance with an embodiment. The electronic package 600 comprises a package substrate 601 with a contact pad 606. In an embodiment, a socket pin 622 is electrically coupled to the contact pad 606 by a coalesced LM 613. The coalescing of the LM 613 provides a mechanical bond between the contact pad 606 and the LM 613, and a mechanical bond between the socket pin 622 and the LM 613. Additionally, the LM 613 may wet up a sidewall surface of the socket pin 622 and along the surface of the contact pad 606. As such, the LM 613 may have a characteristic fillet shape.

Referring now to FIGS. 7A-7E, a series of cross-sectional illustrations depicting a process for attaching a socket pin to a contact pad with a LM is shown, in accordance with an embodiment.

Figure 7A:
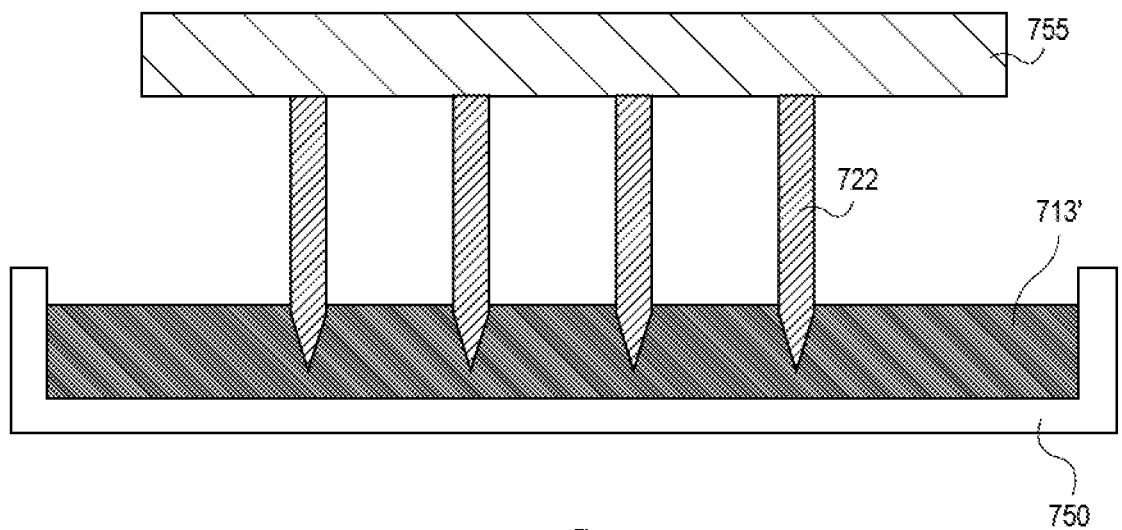
FIGS. 7A-7E are cross-sectional illustrations of a process for attaching a socket pin to a contact pad with a coalesced LM, in accordance with an embodiment.

Referring now to FIG. 7A, a cross-sectional illustration of socket pins 722 attached to a socket substrate 755 is shown, in accordance with an embodiment. As shown, the socket pins 722 are dipped into a bath 750 of a LM 713'. In an embodiment, the LM 713' is an uncoalesced LM 713'. That is, the LM 713' comprises nanoparticles with oxide shells. In an embodiment, the socket pins 722 are dipped into a bath 750 that comprises LM 713' before the LM 713' is sonicated or after the LM 713' is sonicated.

Figure 7B:
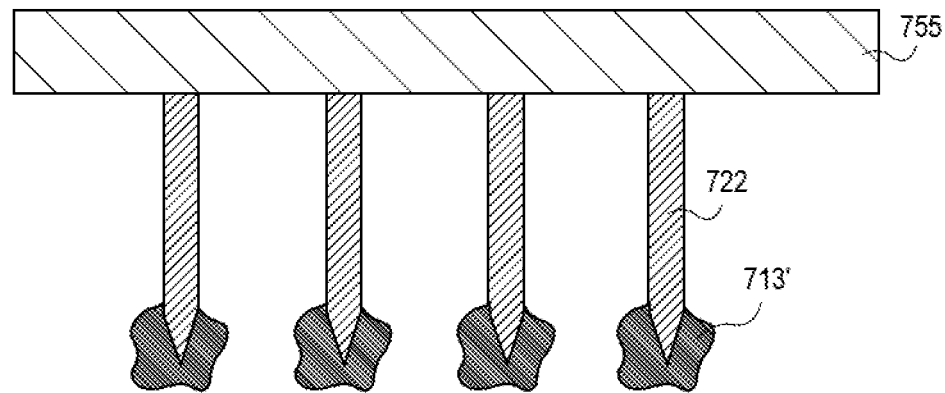

Referring now to FIG. 7B, a cross-sectional illustration of the socket pins 722 after they are extracted from the bath 750 is shown, in accordance with an embodiment. As shown, portions of LM 713' remains attached to the socket pins 722. This is because the oxide shells are tacky, and tend to stick to many different materials, including the socket pins 722.

Figure 7C:
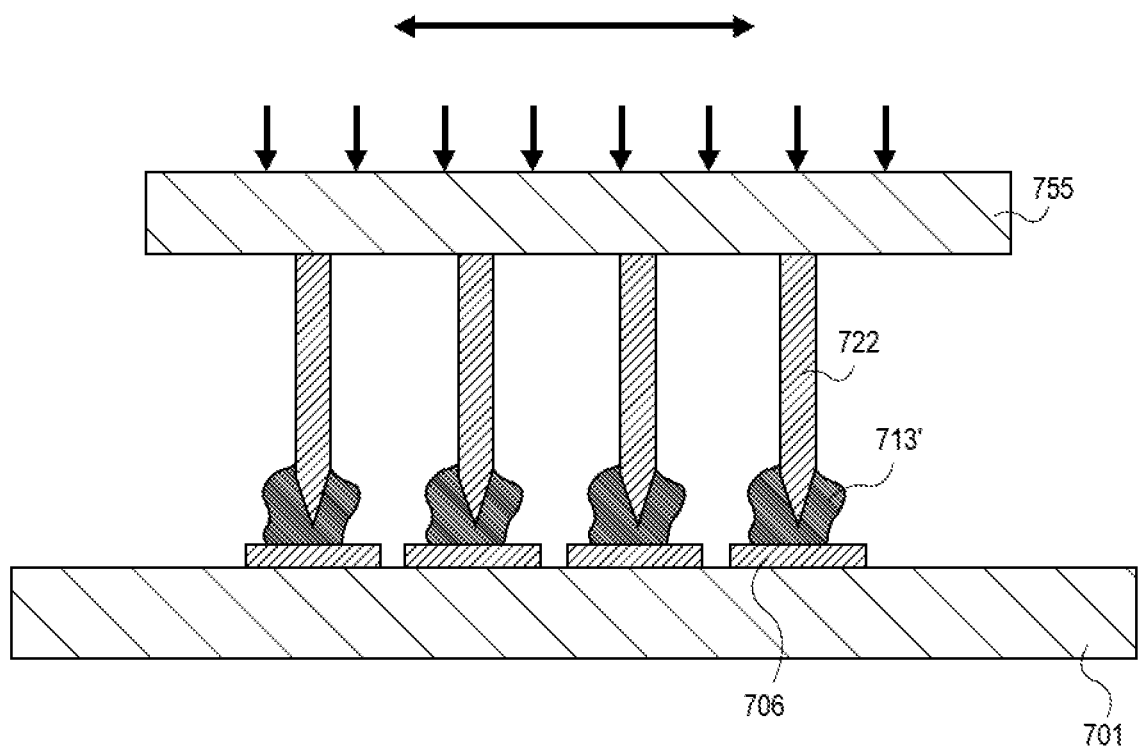

Referring now to FIG. 7C, a cross-sectional illustration of the socket pins 722 being brought into contact with contact pads 706 on a substrate 701 is shown, in accordance with an embodiment. As shown by the arrows, a downward pressure is applied to the socket substrate 755 and the socket substrate is displaced laterally back and forth. This pressure and lateral displacement mechanically breaks the oxide shell and allows the LM 713' to coalesce.

Figure 7D:
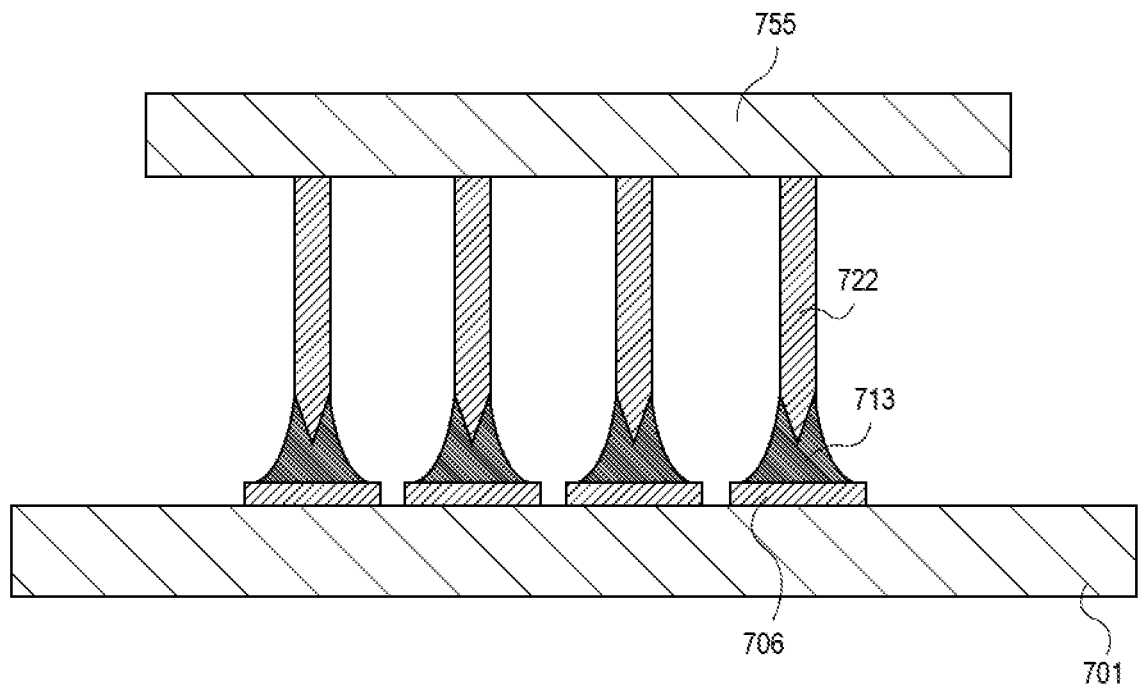

Referring now to FIG. 7D, a cross-sectional illustration of the socket pins 722 attached to the contact pads 706 is shown, in accordance with an embodiment. In an embodiment, the LM 713 is now coalesced and bonded to the socket pins 722 and the contact pads 706. As shown, the LM 713, may form a characteristic fillet shape, as described above.

Figure 7E:
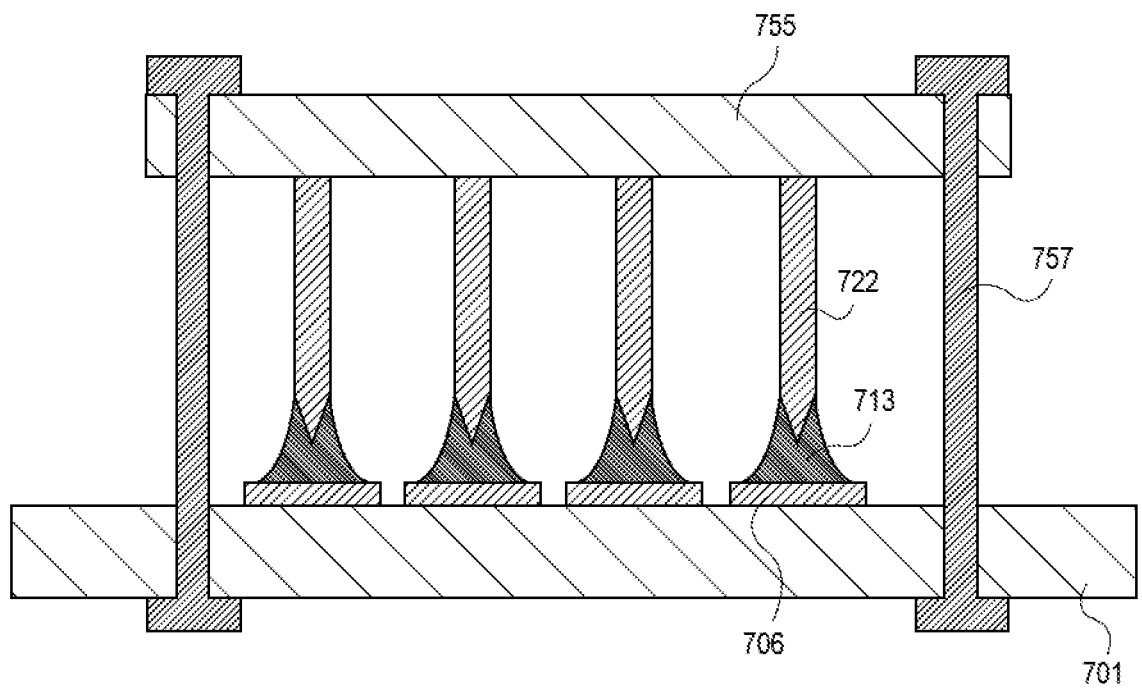

Referring now to FIG. 7E, a cross-sectional illustration of the socket pins 722 after a clamping force is applied between the socket substrate 755 and the substrate 701 is shown, in accordance with an embodiment. A clamping force may be needed in order to secure the socket pins 722 to the contact pads 706. For example, a screw or clamp 757 may span between the socket substrate 755 and the substrate 701.

Figure 8:
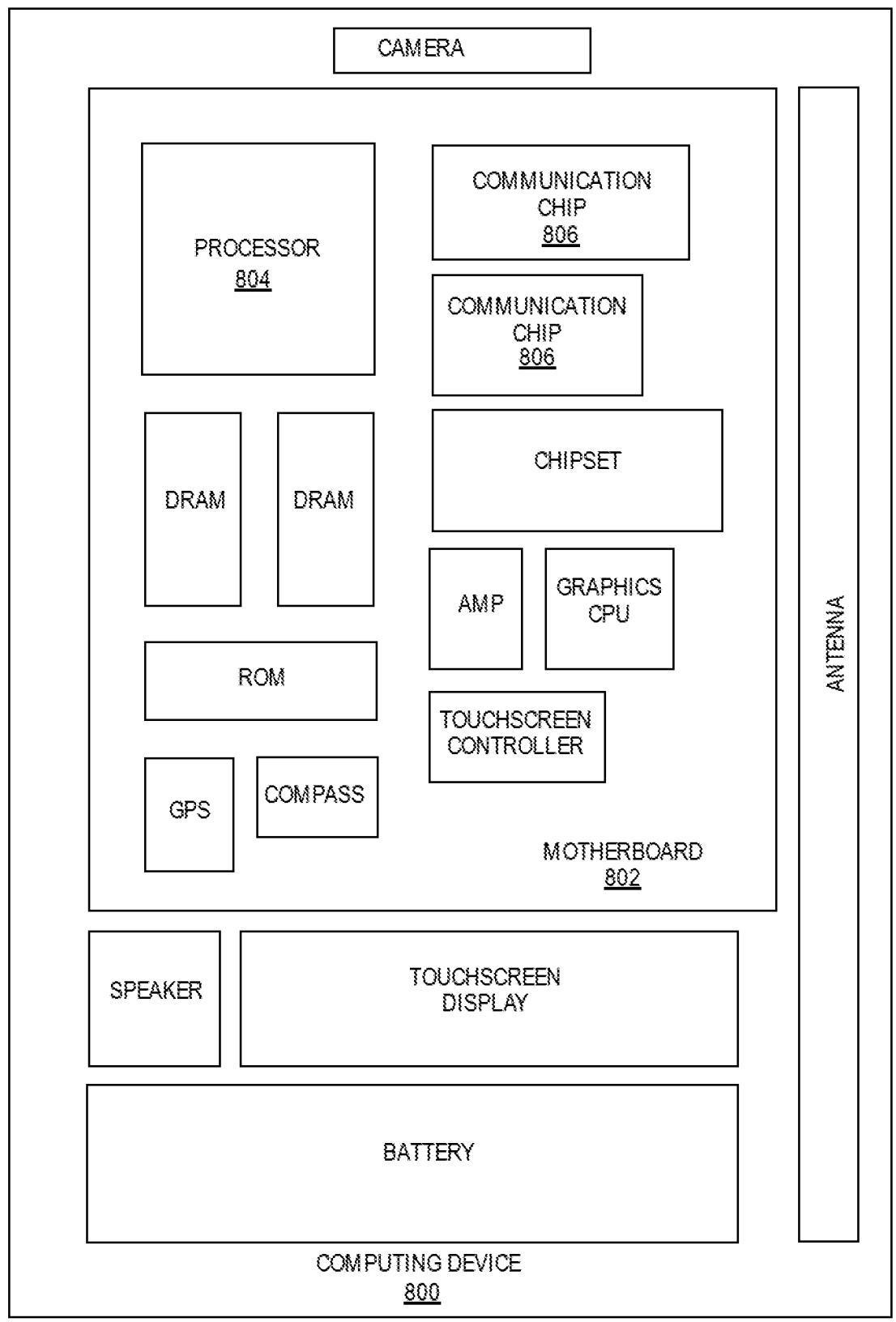
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be part of an electronic package that is electrically coupled to a board with a LM socket interface, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be part of an electronic package that is electrically coupled to a board with a LM socket interface, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate having a first surface and a second surface opposite from the first surface; a die on the first surface of the package substrate; and a socket interface on the second surface of the package substrate, wherein the socket interface comprises: a first layer, wherein the first layer comprises a plurality of wells; a liquid metal within the plurality of wells; and a second layer over the plurality of wells.

Example 2: the electronic package of Example 1, wherein the package substrate comprises a plurality of pads on the second surface, wherein individual ones of the plurality of pads are aligned with individual ones of the plurality of wells.

Example 3: the electronic package of Example 1 or Example 2, wherein the second layer confines the liquid metal to the plurality of wells.

Example 4: the electronic package of Examples 1-3, wherein the second layer comprises a self-sealing material.

Example 5: the electronic package of Examples 1-4, wherein the second layer comprises one or more of a closed cell foam, an open cell foam, a nonwoven mesh, a woven mesh, or an elastic material.

Example 6: the electronic package of Example 5, wherein the second layer is a laminated stack.

Example 7: the electronic package of Example 5, wherein the second layer is a composite material.

Example 8: the electronic package of Examples 1-7, wherein the plurality of wells comprises approximately 7,000 or more wells.

Example 9: the electronic package of Examples 1-8, further comprising: a socket attached to the package substrate, wherein the socket comprises: a socket substrate; and a plurality of pins extending away from the socket substrate, wherein individual ones of the plurality of pins are inserted into individual ones of the plurality of wells.

Example 10: the electronic package of Example 9, wherein the plurality of pins are electrically coupled to the package substrate by the liquid metal.

Example 11: the electronic package of Examples 1-10, wherein the liquid metal comprises gallium or a gallium based alloy.

Example 12: the electronic package of Example 11, wherein the liquid metal in the plurality of wells is coalesced.

Example 13: a socket for providing electrical interconnects to an electronic package, comprising: a substrate; a first layer over the substrate, wherein the first layer comprises a plurality of wells; a liquid metal in the plurality of wells; and a second layer over the first layer, wherein the second layer confines the liquid metal to the plurality of wells.

Example 14: the socket of Example 13, wherein the electronic package is a pin grid array (PGA) package, and wherein a plurality of pins of the PGA package are aligned with the plurality of wells.

Example 15: the socket of Example 13 or Example 14, wherein the second layer comprises a self-sealing material.

Example 16: the socket of Example 15, wherein the second layer comprises one or more of a closed cell foam, an open cell foam, a nonwoven mesh, a woven mesh, or an elastic material.

Example 17: the socket of Examples 13-16, wherein the liquid metal comprises gallium or a gallium based alloy.

Example 18: the socket of Example 17, wherein the liquid metal in the wells is coalesced.

Example 19: the socket of Examples 13-18, wherein the plurality of wells comprises approximately 7,000 or more wells.

Example 20: a socket, comprising: a socket body; a first layer over the socket body, wherein a plurality of openings pass through the first layer and the socket body; a plurality of pins passing through the plurality of openings, wherein individual ones of the plurality of pins comprise a head with a width greater than a width of individual ones of the openings; and a second layer over the first layer, wherein the second layer presses the heads of the plurality of pins against the first layer.

Example 21: the socket of Example 20, wherein the first layer is compressible.

Example 22: the socket of Example 21, wherein the first layer is a foam.

Example 23: the socket of Examples 20-22, wherein the plurality of pins are non-conductive.

Example 24: an electronic system, comprising: a board; and an electronic package electrically coupled to the board by a socket, wherein the socket comprises: a first layer, wherein the first layer comprises a plurality of wells; a liquid metal within the plurality of wells; and a second layer over the plurality of wells.

Example 25: the electronic system of Example 24, wherein the liquid metal comprises a coalesced gallium or a gallium based alloy.

What is claimed is:

1. An electronic package, comprising:
    a package substrate having a first surface and a second surface opposite from the first surface;
    a die on the first surface of the package substrate; and
    a socket interface on the second surface of the package substrate, wherein the socket interface comprises:
        a first layer, wherein the first layer comprises a plurality of wells;
        a liquid metal within the plurality of wells; and
        a second layer over the plurality of wells, wherein the second layer is vertically overlapping with the liquid metal, and wherein the second layer is continuous between adjacent ones of the plurality of wells.

2. The electronic package of claim 1, wherein the package substrate comprises a plurality of pads on the second surface, wherein individual ones of the plurality of pads are aligned with individual ones of the plurality of wells.

3. The electronic package of claim 1, wherein the second layer confines the liquid metal to the plurality of wells.

4. The electronic package of claim 1, wherein the second layer comprises a self-sealing material.

5. The electronic package of claim 1, wherein the second layer comprises one or more of a closed cell foam, an open cell foam, a nonwoven mesh, a woven mesh, or an elastic material.

6. The electronic package of claim 5, wherein the second layer is a laminated stack.

7. The electronic package of claim 5, wherein the second layer is a composite material.

8. The electronic package of claim 1, wherein the plurality of wells comprises approximately 7,000 or more wells.

9. The electronic package of claim 1, further comprising:
    a socket attached to the package substrate, wherein the socket comprises:
        a socket substrate; and
        a plurality of pins extending away from the socket substrate, wherein individual ones of the plurality of pins are inserted into individual ones of the plurality of wells.

10. The electronic package of claim 9, wherein the plurality of pins are electrically coupled to the package substrate by the liquid metal.

11. The electronic package of claim 1, wherein the liquid metal comprises gallium or a gallium based alloy.

12. The electronic package of claim 11, wherein the liquid metal in the plurality of wells is coalesced.

13. A socket for providing electrical interconnects to an electronic package, comprising:
    a substrate;
    a first layer over the substrate, wherein the first layer comprises a plurality of wells;
    a liquid metal in the plurality of wells; and
    a second layer over the first layer, wherein the second layer confines the liquid metal to the plurality of wells, wherein the second layer is vertically overlapping with the liquid metal, and wherein the second layer is continuous between adjacent ones of the plurality of wells.

14. The socket of claim 13, wherein the electronic package is a pin grid array (PGA) package, and wherein a plurality of pins of the PGA package are aligned with the plurality of wells.

15. The socket of claim 13, wherein the second layer comprises a self-sealing material.

16. The socket of claim 15, wherein the second layer comprises one or more of a closed cell foam, an open cell foam, a nonwoven mesh, a woven mesh, or an elastic material.

17. The socket of claim 13, wherein the liquid metal comprises gallium or a gallium based alloy.

18. The socket of claim 17, wherein the liquid metal in the wells is coalesced.

19. The socket of claim 13, wherein the plurality of wells comprises approximately 7,000 or more wells.

20. An electronic system, comprising:
    a board; and
    an electronic package electrically coupled to the board by
        a socket, wherein the socket comprises:
        a first layer, wherein the first layer comprises a plurality of wells;
        a liquid metal within the plurality of wells; and
        a second layer over the plurality of wells, wherein the second layer is vertically overlapping with the liquid metal, and wherein the second layer is continuous between adjacent ones of the plurality of wells.

21. The electronic system of claim 20, wherein the liquid metal comprises a coalesced gallium or a gallium based alloy.

\* \* \* \* \*